United States Patent [19]
Trimberger et al.

[11] Patent Number: 5,594,367
[45] Date of Patent: Jan. 14, 1997

[54] OUTPUT MULTIPLEXER WITHIN INPUT/OUTPUT CIRCUIT FOR TIME MULTIPLEXING AND HIGH SPEED LOGIC

[75] Inventors: Stephen M. Trimberger; Khue Duong, both of San Jose; Robert O. Conn, Jr., Los Gatos, all of Calif.

[73] Assignee: Xilinx, Inc., San Jose, Calif.

[21] Appl. No.: 543,521

[22] Filed: Oct. 16, 1995

[51] Int. Cl.$^6$ ............................................. H03K 19/177
[52] U.S. Cl. ............................. 326/41; 326/38; 326/93
[58] Field of Search .................... 326/38–41, 44, 326/93

[56] References Cited

U.S. PATENT DOCUMENTS

| | | | |
|---|---|---|---|
| 5,365,125 | 11/1994 | Goetting et al. | 326/41 X |
| 5,414,377 | 5/1995 | Freidin | 326/41 |
| 5,436,575 | 7/1995 | Petersen et al. | 326/40 |
| 5,440,247 | 8/1995 | Kaplinsky | 326/39 |
| 5,481,206 | 1/1996 | New et al. | 326/38 |
| 5,504,439 | 4/1996 | Tanana | 326/41 X |

OTHER PUBLICATIONS

Babb, Jonathan; Tessier, Russell; and Agarwal, Anant, "Virtual Wires: Overcoming Pin Limitations in FPGA–based Logic Emulators", IEEE Workshop on FPGAs for Custom Computing Machines, FCCM 93, Apr. 5–7, 1993, pp. 1–15.

*Primary Examiner*—David R. Hudspeth
*Attorney, Agent, or Firm*—Jeanette S. Harms; Anthony C. Murabito

[57] ABSTRACT

A input/output circuit (IOB) within an integrated circuit (IC) device, the output signal driving circuitry of the input/output device contains a dedicated multiplexer on the output path wherein a first and second output signal can be time multiplexed on a single output pad. The multiplexer can also be configured to perform as a high speed gate to realize AND, OR, XOR, and XNOR functions. Within an input/output circuit of a programmable integrated circuit, the system provides a dedicated multiplexer that can select between one of two output signals for sending over the single output pad of the IC device. In lieu of using a programmable memory cell as the select control for the dedicated multiplexer, the system allows a number of lines, including an output clock signal, to be the select control. By using the output clock as the select control, the data signals can be effectively time multiplexed over a single output pad and referenced by the output clock. This effectively doubles the number of output signals the IC device can provide with a given number of pads. The dedicated multiplexer when configured as a high speed gate is useful for generating very high speed system level reset or enable signals or any logic function.

23 Claims, 11 Drawing Sheets

//
5,594,367

OUTPUT MULTIPLEXER WITHIN INPUT/OUTPUT CIRCUIT FOR TIME MULTIPLEXING AND HIGH SPEED LOGIC

BACKGROUND OF THE INVENTION

1. Field of the Invention

The present invention relates to the field of output signal driving circuits. More specifically, the present invention relates to an output signal driver circuit within an input/output circuit of an integrated circuit (IC) device.

2. Background Technology

Programmable integrated circuits, such as field programmable gate arrays (FPGAs), include configurable logical blocks (CLBs), decoders, programmable input/output blocks (IOBs), and an interconnect structure for programmably interconnecting such devices. The IOBs are further coupled to the pads of the integrated circuit and receive/transmit signals over the pads. Typically, each IOB includes an input signal receiving circuit and an output signal driving circuit.

FIG. 1 illustrates a prior art output signal driver 10 located within an input/output block (IOB). Driver 10 receives an output enable signal T that tristates the output signal of buffer 18 when asserted, thereby allowing other circuitry of the IOB (e.g., an input signal receiving circuit) to input a signal over pad 20. When output enable signal T is not asserted, buffer 18 generates an output signal that is sent to pad 20. A clock enable signal CE is provided as an input signal to a multiplexer 12 and as a clock enable signal to a flip flop 14. An output signal O is also provided as an input signal to multiplexer 12. The output signal of multiplexer 12 is provided as an input signal to flip flop 14. Multiplexer 16 receives the output signal of multiplexer 12 and the output signal of flip flop 14. The output signal of multiplexer 16 is provided to the input terminal of buffer 18. Flip flop 14 is clocked by an outside or "output" clock signal OK. Note that although in the embodiments of the present invention described herein clock signal OK serves as a data signal as well as a control signal, any other signal selected by the user can be used for those functions. Multiplexers 12 and 16 have select lines that are individually coupled to programmable memory cells (e.g., SRAMs, or antifuses, or any other means for configuring logic) for configuration.

Although driver 10 is effective for many applications, the configuration memory cells (not shown) for multiplexer 12 and multiplexer 16 are set at IC initialization and not altered during the operation of the device. As such, driver 10 allows either clock enable signal CE or output signal O to be driven over pad 20. In other words, driver 10 does not allow output signal multiplexing over pad 20.

To solve this problem, in one application, a CLB adjacent to an IOB is programmed to act as a multiplexer for multiplexing of output signals over the associated pad. Note that within the periphery of a typical IC, there is typically one CLB located adjacent to two IOBs. A typical CLB contains two programmable lookup tables. Therefore, both lookup tables of a single CLB are consumed in allowing two adjacent IOBs to provide time multiplexing of output signals. This approach is not desirable because all of the CLBs adjacent to the IOBs are consumed and are not available to perform other functions. Further, since the multiplexing functions are performed by a CLB, i.e. outside of the IOB, the interconnect structure is required to link the CLB to the IOB and then out through pad 20. This configuration delays the resultant output signal.

Accordingly, a need arises for an output signal driver that allows output signal multiplexing over pad 20 without requiring a CLB. The present invention provides this feature as well as other advantages.

SUMMARY OF THE INVENTION

A input/output block (IOB) within a programmable integrated circuit (IC) device includes a dedicated multiplexer on the output path wherein a first and second output signal can be time multiplexed on a single output pad. In lieu of using a programmable memory cell as the select control for the dedicated multiplexer, the invention allows a number of lines, including an output clock line, to be the select control. By using the output clock as the select control, the data signals can be effectively time multiplexed over a single IC pad and referenced by the output clock, thereby effectively doubling the number of output signals the IC device can provide with a given number of IC pads. The multiplexer can also be configured to perform as a high speed gate to realize AND, OR, XOR, and XNOR functions. The dedicated multiplexer when configured as a high speed gate is useful for generating very high speed board level reset, enable signals in response to an address match, or any two input logic function.

Specific embodiments of the present invention include a programmable integrated circuit having an input/output block (IOB) having: a multiplexer circuit including a first data terminal, a second data terminal, and an output terminal, the multiplexer circuit including a select line controlled by a third signal (in one embodiment an output clock), wherein the output terminal of the multiplexer circuit is coupled to an input/output pad of said programmable integrated circuit. Other embodiments of the invention include: a first multiplexer circuit receiving a first data signal, receiving a second data signal, and generating an output data signal, the first multiplexer circuit having a select line controlled by an output clock; a second multiplexer circuit coupled to receive the output data signal from the first multiplexer circuit, the second multiplexer circuit having a select line controlled by a programmable memory cell; and a buffer circuit coupled to an output of the second multiplexer circuit for buffering the output data signal, wherein an output of the buffer circuit is coupled to an input/output pad of the programmable integrated circuit; wherein the second multiplexer circuit is programmed to select the output data signal of the first multiplexer circuit and wherein the first multiplexer circuit is for time multiplexing the first data signal and the second data signal over the pad of the programmable integrated circuit referenced by the output clock.

Embodiments of the present invention also include the above and wherein the first data signal is held low and wherein the first multiplexer circuit is for realizing a high speed logic AND gate of the second data signal and the output clock. Embodiments of the present invention also include the above and wherein the first data signal is held high and wherein the first multiplexer circuit is for realizing a high speed logic OR gate of the second data signal and the output clock. Embodiments of the present invention also include the above and wherein the first data signal and an inverse of the first data signal are input to the first multiplexer circuit and wherein the first multiplexer circuit is for realizing a high speed logic XOR gate of the first data signal and the output clock. Embodiments of the present invention also include the above and wherein the first data signal and an inverse of the first data signal are input to the first multiplexer circuit and wherein the first multiplexer circuit is for realizing a high speed logic XNOR gate of the first data signal and the output clock. Other logic functions may also be embodied by holding the select line either low or high.

DETAILED DESCRIPTION OF THE INVENTION

Figure 1:
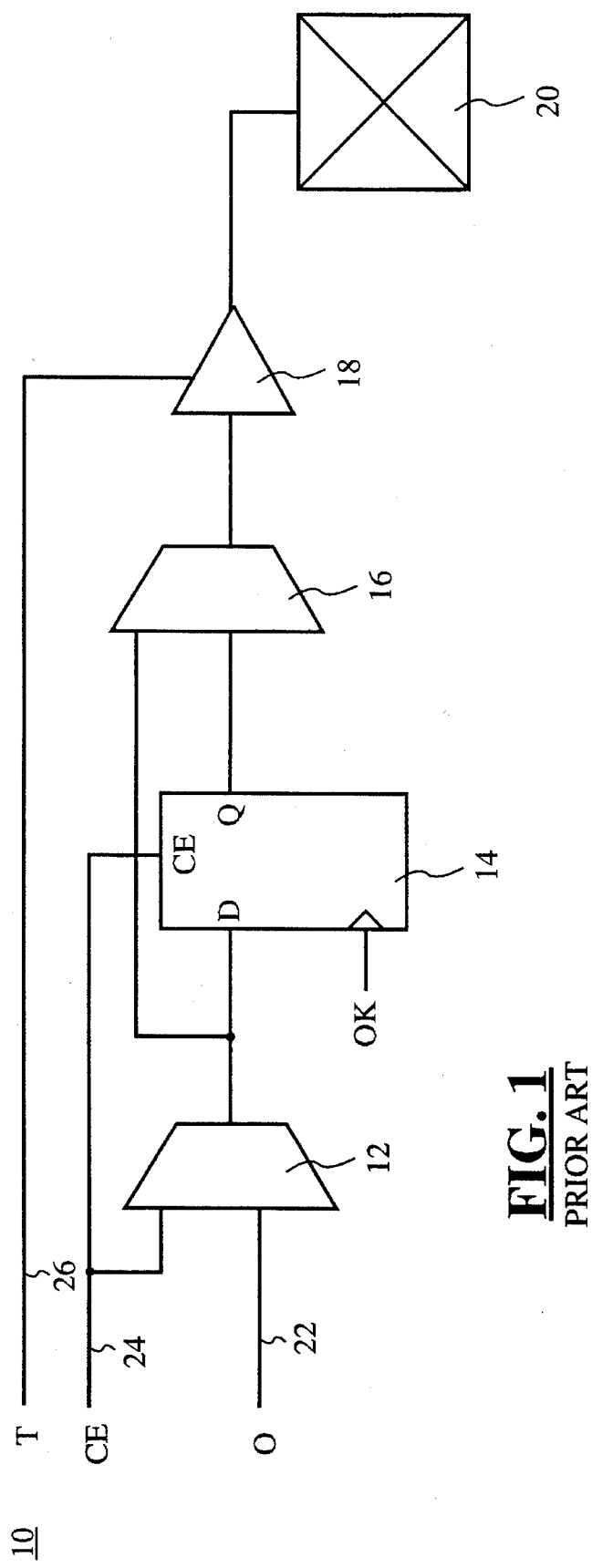
FIG. 1 is a circuit diagram of a prior art output signal driver.
Figure 2:
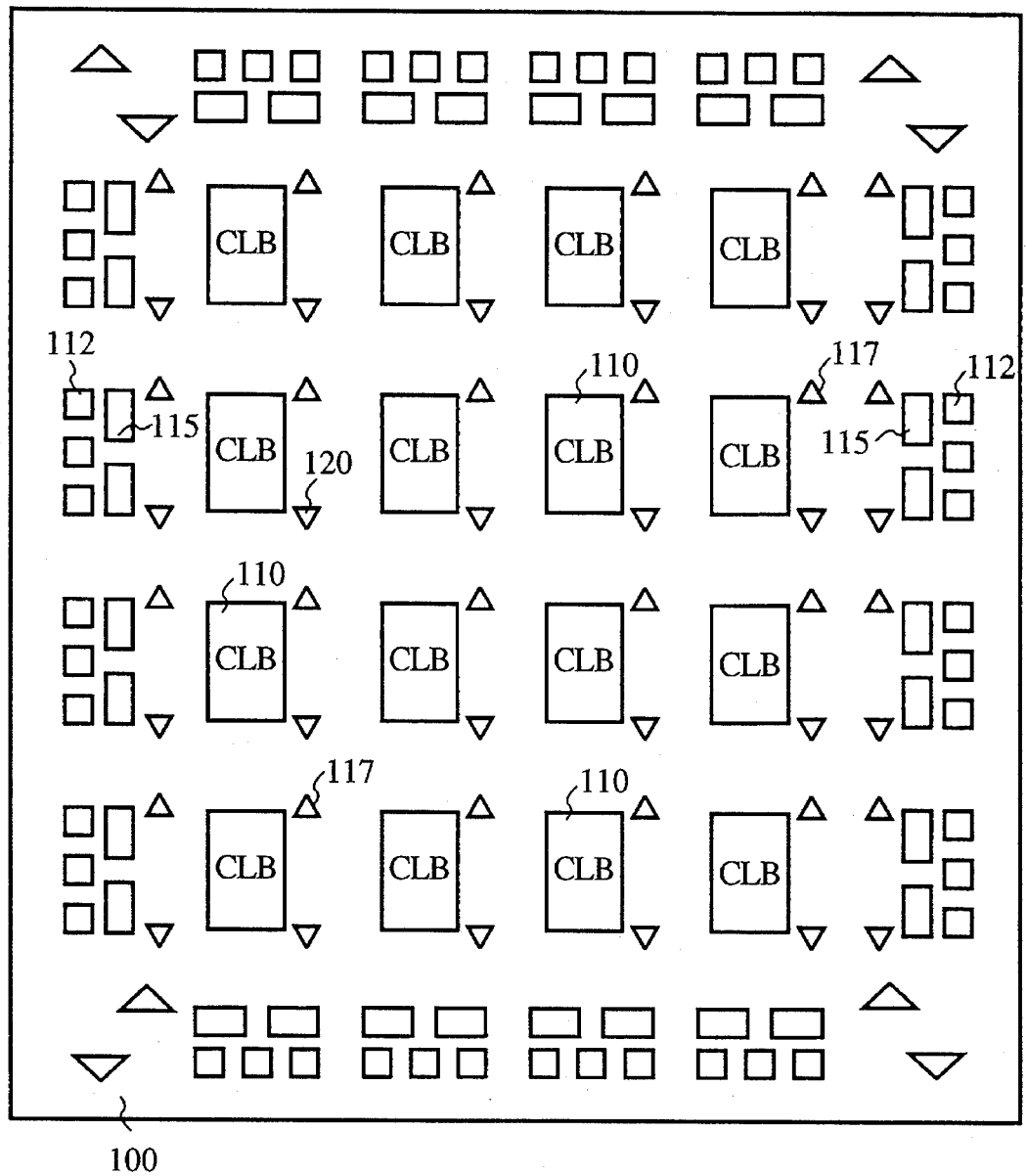
FIG. 2 is a logical diagram of a field programmable gate array IC used in conjunction with the present invention.

FIG. 2 illustrates an exemplary field programmable gate array (FPGA) 100 including a plurality of CLBs 110 arranged in a matrix configuration, optional decoder circuits 112, input/output blocks (IOBs) 115, and buffer 17. A programmable interconnect structure (not shown) programmably interconnects the above elements using SRAM devices or antifuses. Each IOB 115 is coupled to an input/output pad (not shown) which is in turn coupled to an external pin of the packaged FPGA (i.e. chip). The IOBs transfer input and output signals (e.g., data, address, clock, and control signals) for FPGA 100. Except to the extent described in accordance with the present invention, the above configuration and elements therein are well known in the art and, therefore, not described in detail herein.

Figure 3:
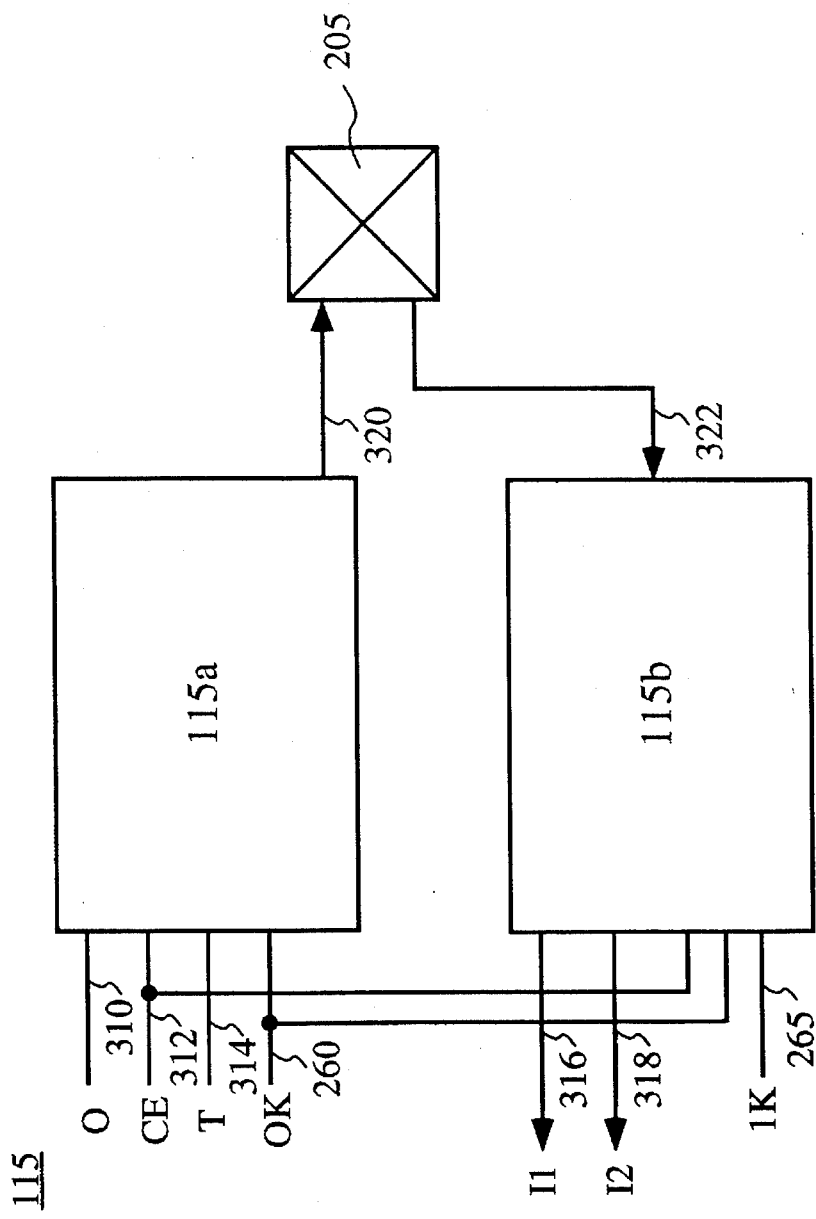
FIG. 3 is a logical diagram of input signal receiving circuit and output signal driving circuit blocks of an input/output block in accordance with the present invention.

FIG. 3 illustrates an IOB 115 in accordance with the present invention which includes an output signal driving circuit 115a and an input signal receiving circuit 115b. Both circuits 115a and 115b are coupled to pad 205 using lines 320 and 322, respectively. Output signal driving circuit 115a receives an output signal O over line 310, a clock enable signal CE over line 312, a tristate signal T over line 314, and an output clock signal OK over line 260. Note that signals O and CE are typically for output signals over pad 205. Input signal receiving circuit 115b receives the CE signal on line 312, the OK clock on line 260, as well as an input (global low skew) clock IK over line 265. Input signal receiving circuit 115b generates two signals: the I1 signal on line 316 and the I2 signal on line 318. Signals I1 and I2 are routed to and used by CLBs internal to FPGA 100.

Figure 4:
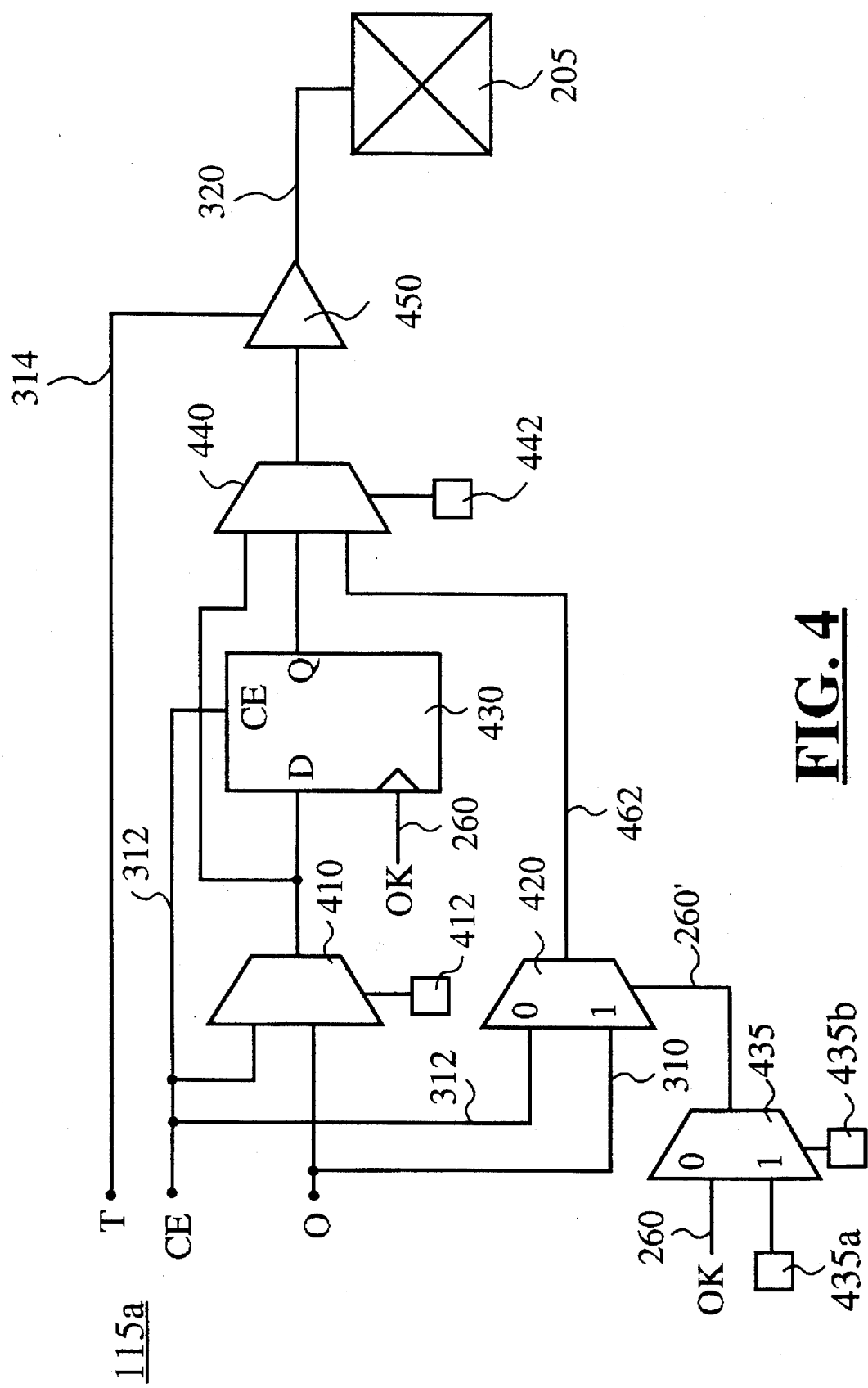
FIG. 4 is a circuit diagram of the output signal driving circuitry of the present invention including the dedicated output multiplexer having the output clock as its selection control signal.

FIG. 4 illustrates one embodiment of output signal driving circuit 115a in greater detail. Signals O and CE are provided to a multiplexer 410 and a multiplexer 420 (referred to as an output mux). Signal CE is also provided to the clock enable input of flip flop 430. In this manner, signal CE can be used as a clock enable signal or can be used as a data output signal (such as signal O).

In the embodiment shown in FIG. 4, an output signal of multiplexer circuit 435 controls the selection circuitry of multiplexer circuit 420. The input signals of multiplexer circuit 435 include the OK signal over line 260 and a value stored in a programmable memory cell 435a. The select line of multiplexer 435 is coupled to a programmable memory cell 435b. In an alternative embodiment, the select line for multiplexer circuit 420 directly receives signal OK on line 260'.

If IOB 115 is in an input receiving mode, signal T 314 causes buffer 450 to generate a high-impedance (unconnected) output signal, thereby allowing an input signal to travel from pad 205 to the input signal receiving circuit 115b over line 322 (FIG. 3). On the other hand, if IOB 115 is in an output driving mode, signal T causes buffer 450 to transfer a signal over line 320 to pad 205.

The select line for multiplexer circuit 410 of FIG. 4 is coupled to a programmable memory cell 412 (or an antifuse cell) for configuration of the selection control. The output terminal of multiplexer circuit 410 is coupled to the D input terminal of flip flop 430 and an input terminal of multiplexer 440. Flip flop 430, which is clocked by signal OK over line 260, provides an input signal to multiplexer 440. Multiplexer 440 also receives an input signal from multiplexer 420. The select line for multiplexer circuit 440 of FIG. 4 is coupled to programmable memory cells 442 (or antifuse cells) for configuration of selection control. The output of multiplexer circuit 440 is coupled to the input of buffer (i.e. driver) 450. An output signal of buffer 450 drives pad 205 via line 320.

In accordance with the present invention, multiplexer 420 is a dedicated multiplexer built within individual IOBs. Because select line 260' receives signal OK, rather than a stored value within a programmable memory cell (as with multiplexer 410 and 440), multiplexer 420 allows two output signals, CE and O, to be time multiplexed as output signals over pad 205. In the time multiplexed mode, multiplexer 440 is programmed by memory cell 442 to select the input line that originates from multiplexer circuit 420 (e.g., via line 462). The signals over line 462 are therefore passed to buffer/driver 450 and then to pad 205. In this mode, signal OK provides the clock reference as a select line of multiplexer circuit 420, wherein in one embodiment, multiplexer 420 selects line "0" if signal OK is low and selects line "1" if signal OK is high.

Because FPGA 100 (FIG. 2) typically includes an IOB for each pad, the number of possible signals output by FPGA 100 in accordance with the present invention can be as high as twice the pad count. Moreover, as described further below, in addition to time multiplexing of output signals from an IOB, multiplexer circuit 420 can also be used as a high speed logic gate.

Figure 5:
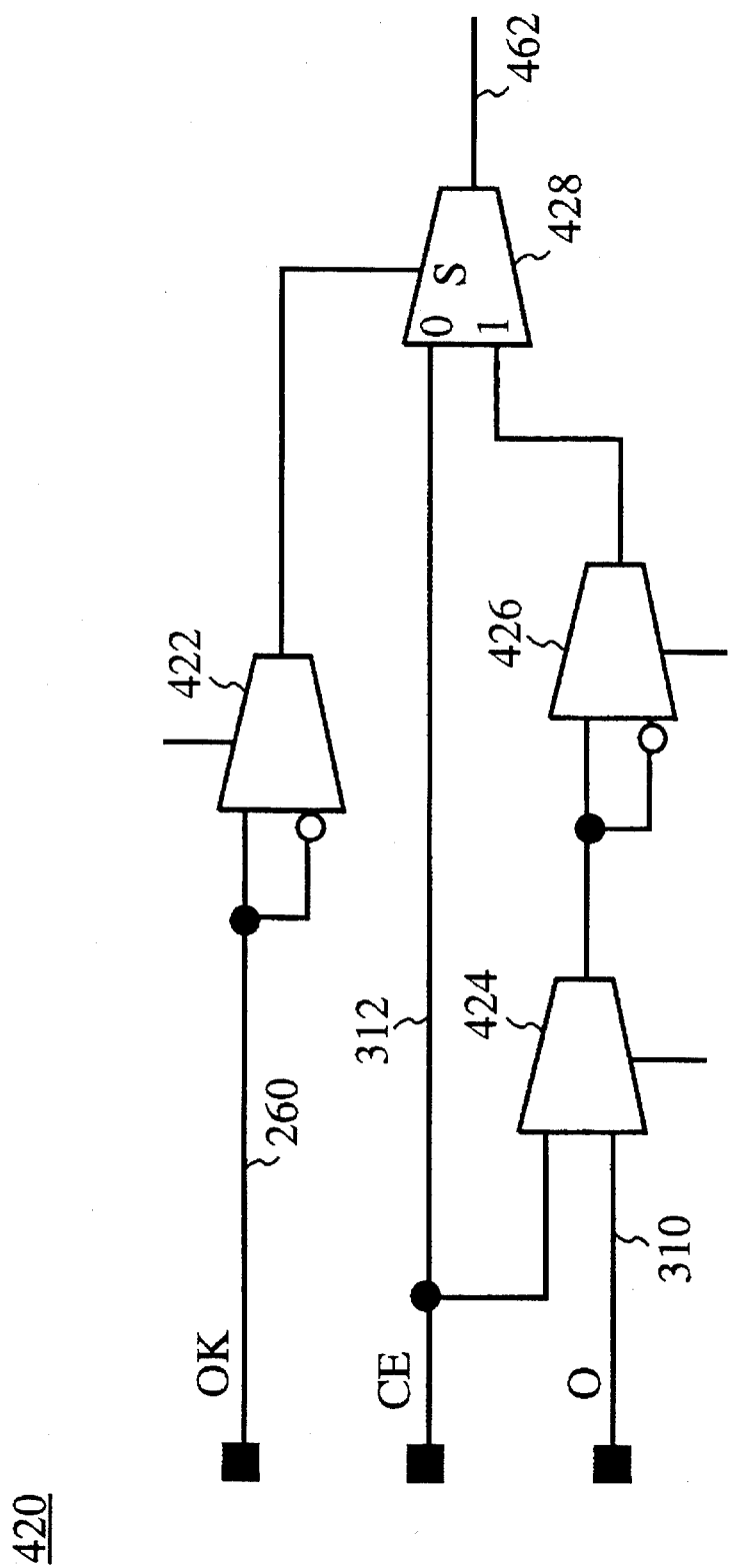
FIG. 5 is a circuit diagram illustrating one embodiment of the output multiplexer of the present invention allowing inversion of the input signals.

Referring to FIG. 5, one embodiment of multiplexer 420 allows signals OK, CE and O to be supplied normally or inverted. For example, line 260 provides both signal OK and the inverse of signal OK (e.g., /OK) to multiplexer 422. A programable memory cell (not shown) is coupled to the select line of multiplexer 422. By programming multiplexer 422, signal OK or /OK is supplied to the select input terminal of a multiplexer 428.

Signal CE is provided via line 312 to the input terminals of multiplexer 428 and multiplexer 424. Signal O is provided to the other input terminal of multiplexer 424. A programable memory cell (not shown) is coupled to the select line of multiplexer 424. The output signal of multiplexer 424 (e.g., either signal CE or O) is provided to one input terminal of multiplexer 426. The inverse of the output signal of multiplexer 424 (e.g., either signal /CE or /O) is provided to the other input terminal of multiplexer 426. A programable memory cell (not shown) is coupled to the select line of multiplexer 426. The output terminal of multiplexer 426 is coupled to the other input terminal of multiplexer 428. In this configuration, multiplexer 428 can receive inputs of: CE and /CE; or CE and CE; or CE and O; or CE and /O. As described in detail below, this flexibility is useful in applications when multiplexer 420 is configured as a high speed logic gate.

Figure 6:
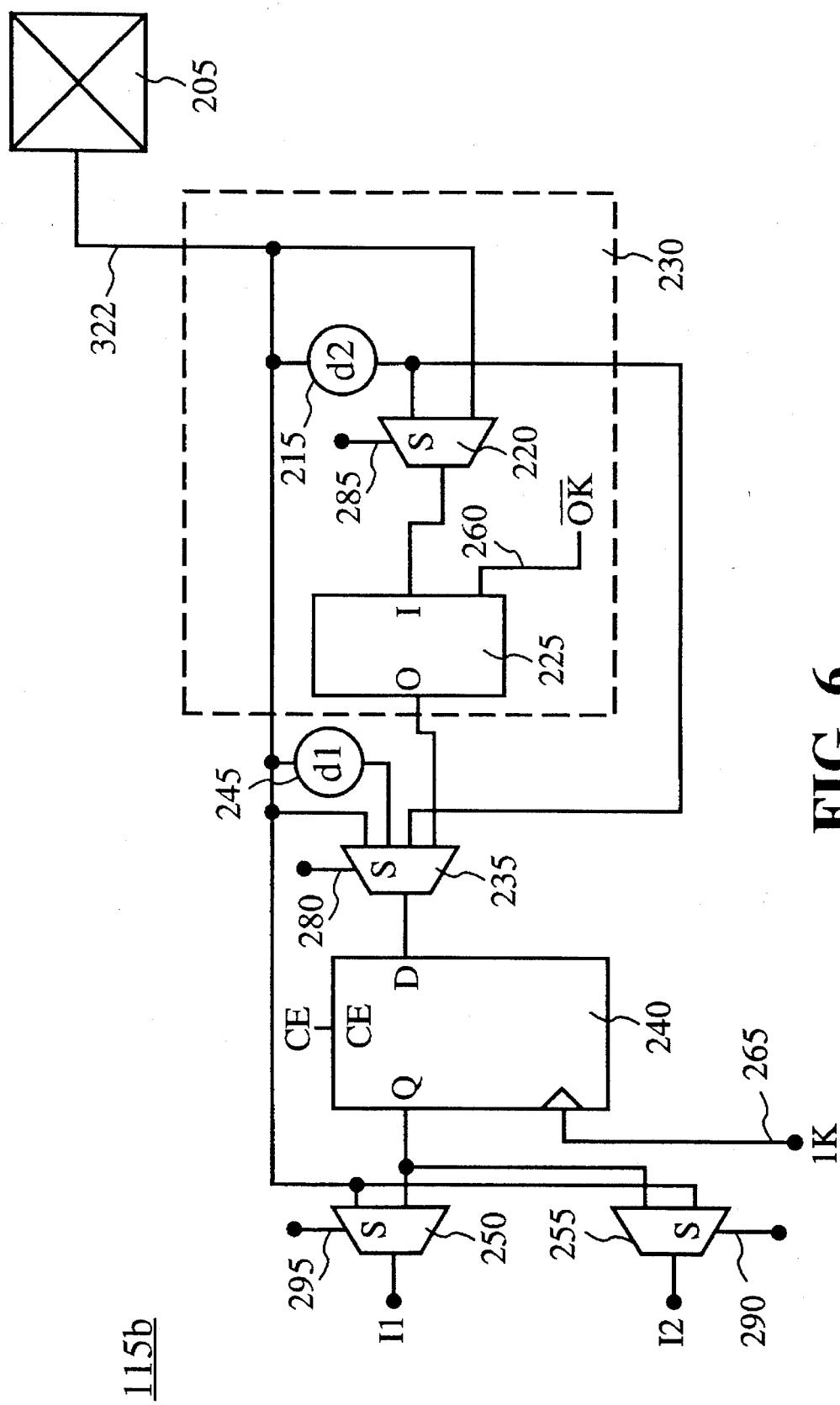
FIG. 6 is a circuit diagram of the input signal receiving circuitry of the present invention input/output block.

FIG. 6 illustrates input signal receiving circuit 115b in greater detail. As described below and in accordance with the present invention, circuit 115b is able to receive time multiplexed signals generated from output signal driving circuit 115a, typically generated from some other IOB on some other chip.

The output clock signal OK is inverted and supplied over line 260 in one embodiment. Signal OK may pass through a clock distribution network that may not substantially delay the clock signal with reference to the clock signal seen at the clock input pad. External pad 205 can receive data signals (synchronized to the output clock) from an external system.

Optional circuit 230 of FIG. 6 interfaces to receive data over a data line 322 using the output clock reference. Input data on data line 322 is supplied to a delay unit 215 that delays the data a predetermined amount of time d2. The value of d2 is typically set during IC design and in one embodiment is set between 1 and 5 nanoseconds. The output terminal of delay unit 215 is coupled to an input terminal of multiplexer 220. Data line 322 is also directly coupled to the other input terminal of multiplexer 220. Multiplexer 220 contains a select line 285 that is coupled to a programmable memory cell (not shown) to provide programmable selection between the signal from a delay unit 215 and the signal on data line 220. The output terminal of multiplexer 220 is coupled to the input terminal I of a transparent latch 225. A clock input terminal of latch 225 is coupled to line 260. When the signal 260 (e.g., /OK) is high, the signal on the output terminal O retains its last value and does not respond to the signal on the input terminal I of latch 225. Note that if signal 260 is low, the signal on the output terminal O follows the signal on the input terminal I of latch 225.

Multiplexer 235 receives a first input signal from latch 225, a second input signal from data line 322, and a third input signal from a delay unit 245 and a fourth input signal from delay unit 215. Delay unit 245 adds a delay d1 to the data signals over data line 322. (Note that delay unit 215 adds a delay d2 to the data signals over data line 322). Once again, the values of d1 and d2 are typically set during IC design, and in one embodiment is set within the range of 1 to 5 nanoseconds. (Note that delays d1 and d2 are set differently to accomodate the slower de-skewed clocks and faster clocks that may be used. Moreover, in other embodiments of the present invention, delays d1 and d2 are adjustable by programmable memory cells or dynamically reconfigurable by the user.) The select line 280 for multiplexer 235 is coupled to a programmable memory cell, such as an SRAM or antifuse (not shown), for selection configuration.

The D input terminal of flip flop 240 receives the output signal of multiplexer 235. Note that flip flop 240, in other embodiments of the present invention, is configured as a latch. Flip flop 240 also receives clock enable (CE) signal as well as input clock signal IK on line 265. The signal on the Q output terminal of flip flop 240 is provided to multiplexers 250 and 255. These two multiplexers also receive signals on data line 322. Each select line 295 and 255 of multiplexers 250 and 255 is coupled to a programable memory cell (not shown) for selection configuration. Multiplexer 250 generates an I1 output signal, whereas multiplexer 255 generates an I2 output signal.

In operation, delay d2 compensates for propagation delay (if any) associated with the output clock from pad 110 to the clock terminal of latch 225. In this manner, if multiplexer 220 is programmed to select the output signal of delay circuit 215, the the next-cycle-data signal over data line 322 does not arrive before the new clock edge of the output clock signal OK supplied over line 260 to ensure a very low (i.e. zero (0) nanosecond) hold time for the data with respect to the output clock. Note that delay d2 does not need to be used, and therefore allows a user to adjust the timing relationship of clock and data.

Using circuit 230 of FIG. 6, and clocking based on the inverse of output clock signal OK, circuit 115b provides a mechanism for latching input data into IOB circuit 115 using substantially the same clock signal as the clock signal provided on the clock output pad. Thus, the present invention allows IOB 115 to offer a very low chip hold time regarding the input data and provides an interface with an external system supplying clock and data signals.

Because other circuitry of the integrated circuit FPGA 100 is synchronized based on global low skew clock signal IK, input signal receiving circuit 115b utilizes flip flop 240 to synchronize the input data to the IK clock. For flexibility, multiplexer 235 transfers a signal on data line 322, a signal from delay circuit 245, a signal from delay 215, or the signal on output terminal O from latch 225 to the D input of flip flop 240. The delay circuit 245 serves an analogous function as delay circuit 215. Specifically, delay d1 compensates for the propagation delay associated with global low skew clock signals to the clock terminal of flip flop 240. Thus, if multiplexer 235 selects the signal on output terminal O of latch 225, the data is synchronized to the IK clock signal by flip flop 240.

The synchronized output signal of flip flop 240 is then selectively provided as signals I1 or I2, as needed, using multiplexer 250 or multiplexer 255, respectively. Alternatively, multiplexer 250 and 255 provides the signals on data line 322 directly. The input signal receiving circuit 115b therefore can (1) receive data clocked at substantially the same clock signal as seen over the input clock source (e.g., with negligible skew) so that external devices are not held up by the FPGA 100, while at the same time can (2) supply that data synchronized with global low skew clock IK.

Figure 7:
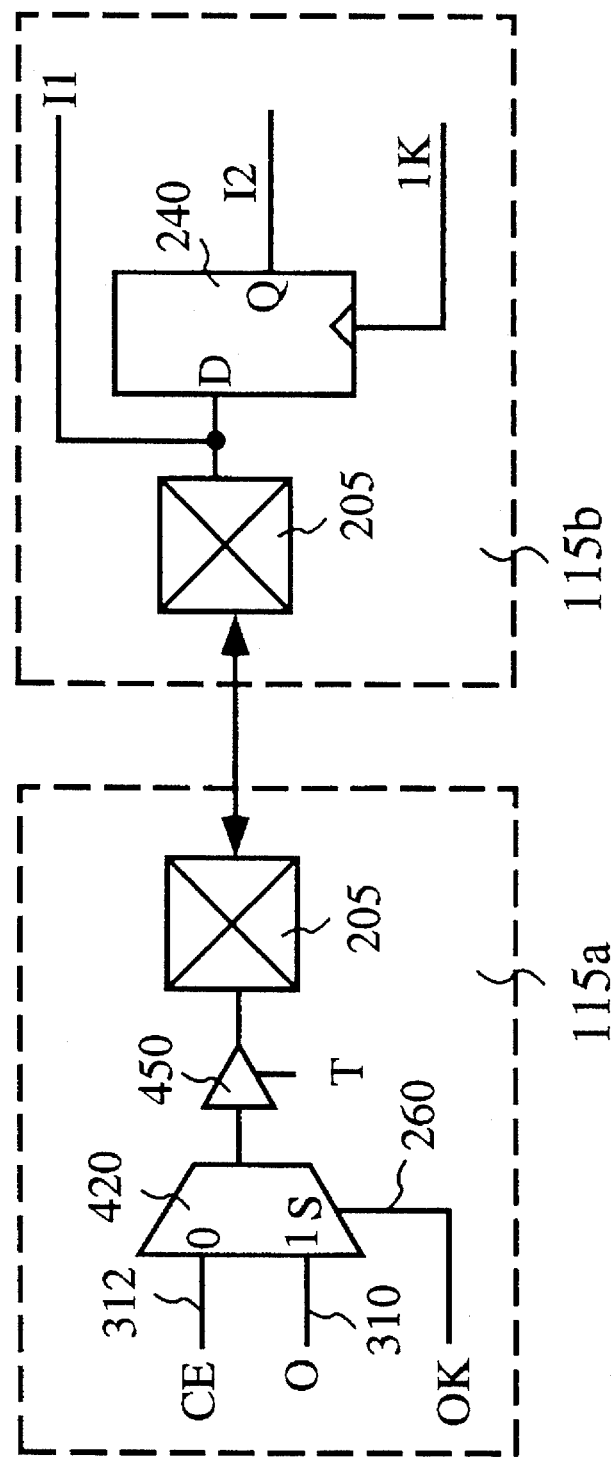
FIG. 7 illustrates a sending and receiving configuration in accordance with the present invention including time multiplexing signal transmission.

FIG. 7 illustrates a transmission configuration including programmed embodiments of output signal driving circuit 115a and input signal receiving circuit 115b to illustrate the time multiplexing advantages of the present invention. Circuits 115a and 115b provide time multiplexing of certain output signals, i.e. signals CE and O. As shown, signal OK is provided on the select line for output multiplexer circuit 420, signal O 310 is provided on the "1" input terminal, and signal CE 312 is provided on the "0" input terminal. The output signal of multiplexer 420 is buffered by buffer 450 and then provided to pad 205. Pad 205 is coupled to pad 205' which is associated with another FPGA (or IOB). Pad 205' is coupled to the D input of flip flop 240 which is clocked by global low skew clock signal IK. In this example, signals IK and OK have the same frequency, but are shifted in relation to one another to allow for data propagation between the FPGAs. Signal I1 is taken directly from pad 205', whereas signal I2 is clocked and taken from the Q output terminal of flip flop 240.

Figure 8:
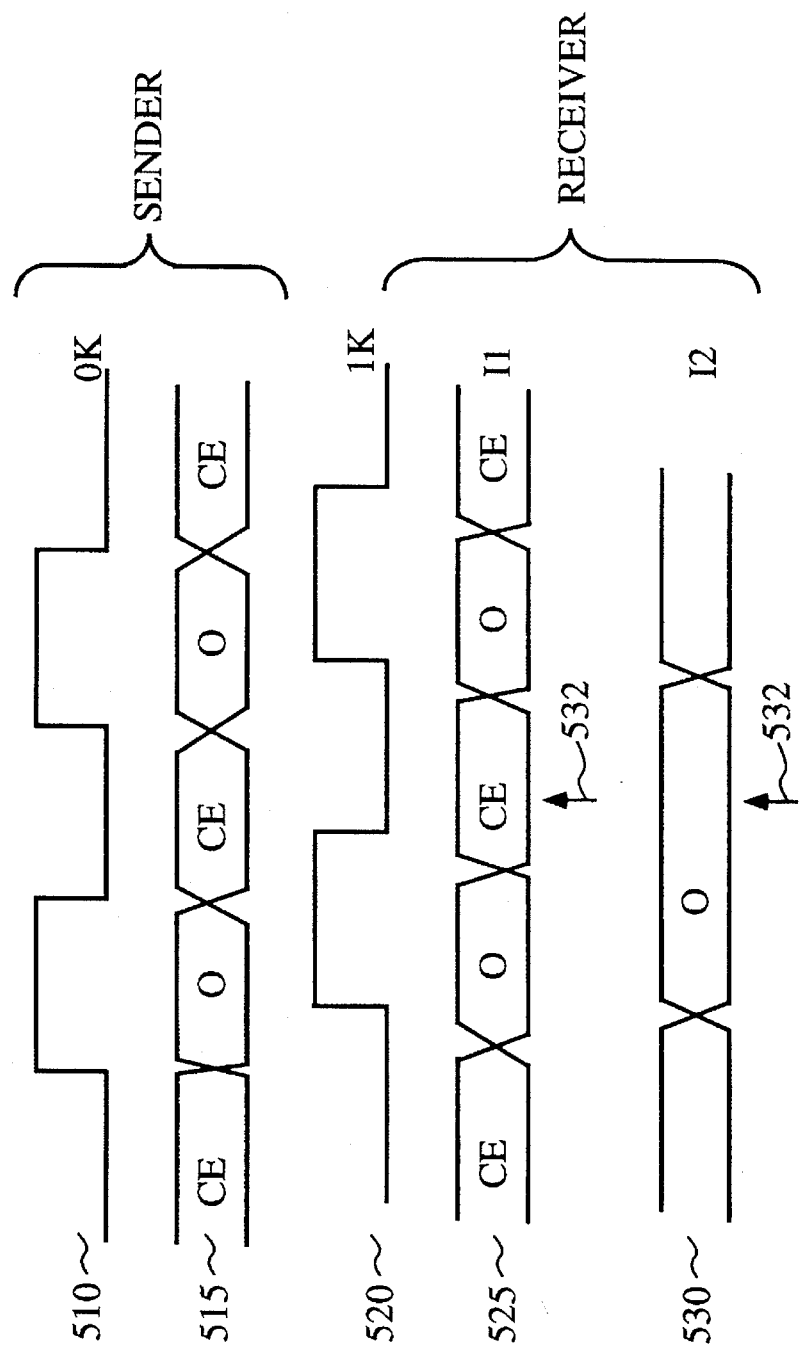
FIG. 8 illustrates timing diagrams between a sender and receiver circuits within two IOBs for a time multiplexed transmission in accordance with the present invention.

FIG. 8 represents a timing diagram of the time multiplexing embodiment of the present invention. Signal OK is represented as signal 510. The output data signal over pad 205 from circuit 115a is shown as signal 515. As shown in FIG. 8, data signal O is transmitted when output clock signal OK is high and data signal CE is transmitted when signal OK is low. Signal 520 is the global low skew clock signal IK, and as shown is slightly delayed with respect to output clock signal OK, thereby compensating for the propagation of data signal 515 between the two FPGAs.

Referring to FIGS. 7 and 8, if signal OK (520) goes high, data signal O is provided on pad 205' (i.e. signal 525) and is subsequently latched into flip flop 240 with global low skew clock IK. Once latched, signal I2 (530) provides the data from terminal O. When signal OK goes low, data signal CE (525) is transmitted and received over pad 205' and provided as signal I1 which bypasses flip flop 240. At time 532, signal I1 (525) is data CE whereas signal I2 (530) is data O. These signals can then be used by other CLBs of the receiving FPGA. The process is then repeated.

By multiplexing two output signals over pin 205, the present invention effectively doubles the output capacity of pad 205, and therefore of FPGA 100. Without multiplexer 420 in the IOB of the present invention, look-up tables (LUTs) within the CLBs are required to provide this multiplexing ability. As discussed, this prior art method requires that all of the CLBs may be consumed along the entire outside ring of the FPGA to perform the multiplexing if maximum output is required. The present invention avoids this disadvantage.

It is appreciated that by using tristate signal T, the present invention output multiplexer 420 can multiplex three or more signals over pad 205 and pad 205' using bidirectional transmission. Under a three signal embodiment, a first IOB is coupled to transmit signals to a second IOB. Signal T is asserted in a second IOB and a first signal can be sent from a driver 155a of a first IOB and latched into flip flop 240 of circuit 155b of the second IOB. Signal T can then be asserted within the first IOB and de-asserted in the second IOB. A second signal can then be sent from the driver 155a of the second IOB and latched into flip flop 240 of circuit 155b of the first IOB. The third signal can then be sent from driver 155a of the second IOB and received directly over the data line (signal I1) of the first IOB.

Using the above embodiment, if a flip flop is used from a nearby CLB, then a fourth signal can be latched into a receiving IOB and four signals can be multiplexed using the above arrangement. Note that expanding the number of CLBs can increase the number of muxed signals indefinitely.

The ability to multiplex output signals is particularly useful within emulator systems or other systems with multiple FPGAs where it is not uncommon to have 400 or more output signals, wherein typical FPGA chips have only 200 IOBs. In emulator systems, the output signal frequency is not a critical issue. Therefore, time multiplexing of the output signals using the present invention is ideal for providing the required 400 outputs with only 200 IOBs.

Referring back to FIGS. 4 and 5, another embodiment of the present invention allows output multiplexer circuit 420 to function as a high speed logic gate. By manipulating signals O, OK, CE, and their inverse signals, output multiplexer 420 functions as a very high speed AND, OR, XOR, and any other version of a two input logic gate circuit. In addition, by further manipulating O, OK, and CE the logic function can be changed, e.g. from an AND gate to an OR gate.

Figure 9A:
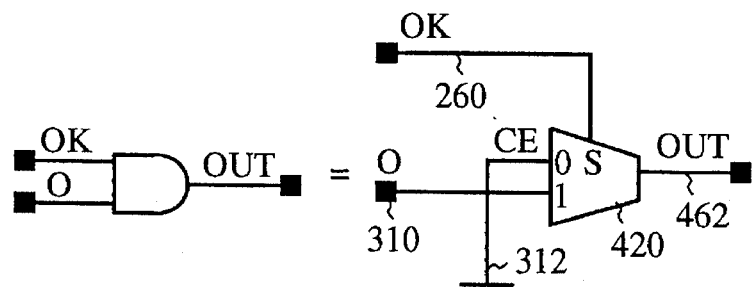
FIG. 9A, FIG. 9B, FIG. 9C, and FIG. 9D are configurations of the output multiplexer of the present invention for realizing different AND functions.

FIG. 9A illustrates one exemplary gate configuration wherein signal OK is used as the select signal for multiplexer 420, signal CE provides a logic zero into the "0" input terminal of multiplexer 420, and signal O is provided to the "1" input terminal of multiplexer 420. In this manner, an output line 462 of multiplexer 420 provides the AND function of signals O and OK. The circuit of FIG. 9A can be used, for example, as the last stage of a high speed address matching circuit. In this application, signal OK can be sourced from a fast clock (about 4–5 ns from the pad). From pin to pin, through multiplexer 420, the delay is roughly 7.5 ns (4 ns from pad to OK plus 3.5 ns O pin to pad). Typical use as an AND gate allows a wide AND for address decode to be performed in an edge decoder 112 (see FIG. 2). This signal can be ANDed with a fast write signal in this fast multiplexer 420, producing /CS with very little delay with respect to the WRITE strobe. The edge decode has a direct path to the CE pin. As shown with respect to FIG. 5, input multiplexers allow each input signal to be inverted.

Figure 9B:
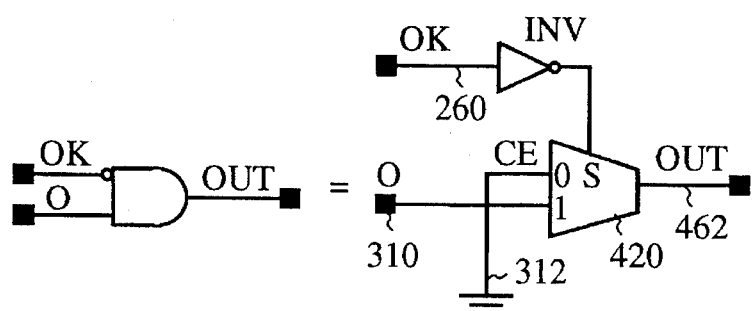
Figure 9C:
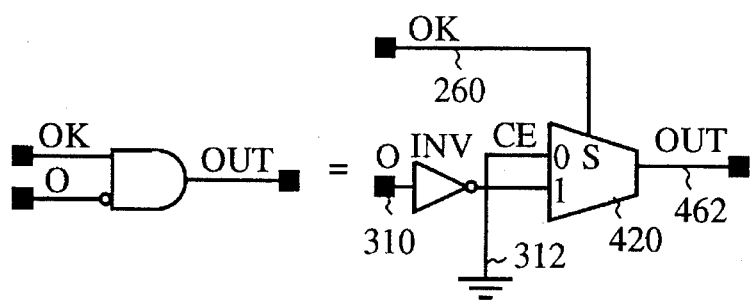
Figure 9D:
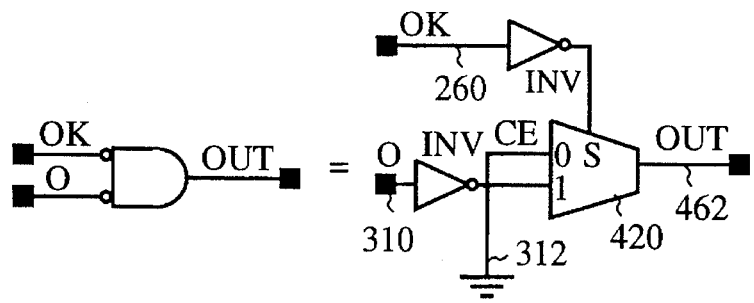

FIG. 9B illustrates an exemplary configuration of output multiplexer 420, wherein the inverse of signal OK is used as the select line for multiplexer 420, signal CE carries a "0" into the "0" input terminal of multiplexer 420 and signal O is fed into the "1" input terminal of multiplexer 420. The output 462 of multiplexer 420 is the AND function of signal O and /OK. FIG. 9C illustrates an exemplary configuration of output multiplexer 420, wherein signal OK is used as the select line for multiplexer 420, signal CE carries a "0" into the "0" input terminal of multiplexer 420 and signal O is inverted (obtained from multiplexer 426) and fed into the "1" input terminal of multiplexer 420. The output line 462 of multiplexer 420 provides the AND function of signals /O and OK. FIG. 9D illustrates an exemplary configuration of output multiplexer 420, wherein the inverse of signal OK is used as the select line for multiplexer 420, the signal CE carries a logic zero into the "0" input terminal of multiplexer 420 and the inverse of signal O (obtained from multiplexer 426) is fed into the "1" input terminal of multiplexer 420. The output line 462 of multiplexer 420 provides the AND function of signals /O and /OK. Table I below illustrates the logic gates realized by output multiplexer 420 and the appropriate figure showing the gate configuration.

TABLE I

| Function | FIG. |
| --- | --- |
| OK AND o | FIG. 9A |
| /OK AND o | FIG. 9B |
| OK AND /o | FIG. 9C |
| /OK AND /o | FIG. 9D |

An alternative embodiment adds a multiplexer on line 312 (of FIG. 5) to allow /CE. By utilizing the configurations of FIG. 9A, FIG. 9B, FIG. 9C, and FIG. 9D but (1) tieing the O signal line (line 310) low, instead of the CE signal line (line 312), and (2) configuring the CE signal line like the O signal line of the figures, the present invention output multiplexer 420 can alternatively realize the following functions: OK AND CE; /OK AND CE; OK AND /CE; and /OK AND /CE.

Figure 10A:
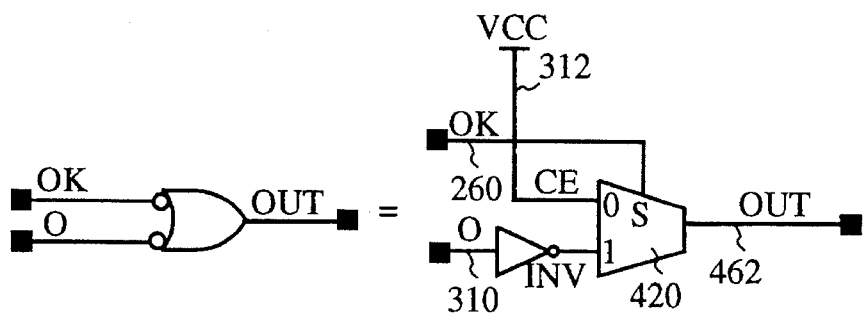
FIG. 10A, FIG. 10B, FIG. 10C, and FIG. 10D are configurations of the output multiplexer of the present invention for realizing different OR functions.

Output multiplexer 420 of the present invention can also be configured to perform OR functions. FIG. 10A illustrates an exemplary configuration of output multiplexer 420 wherein the signal OK is used as the select line, signal CE carries a "1" into the "0" input terminal and the inverse of signal O is fed into the "1" input terminal. In this manner, the output line 462 of multiplexer 420 provides the OR function of signals /O and /OK.

Figure 10B:
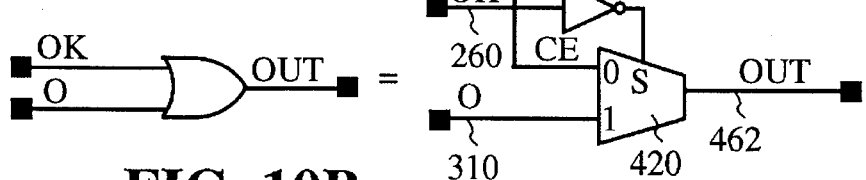
Figure 10C:
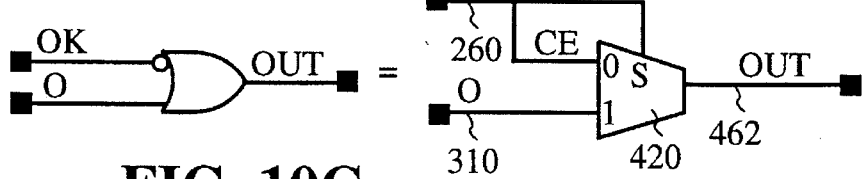
Figure 10D:
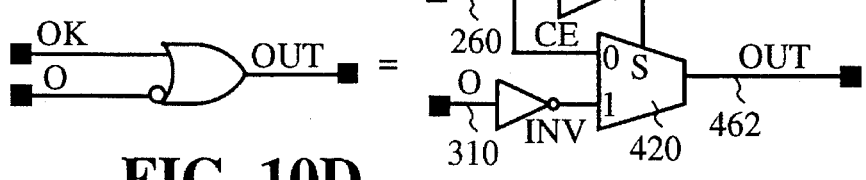

FIG. 10B illustrates an exemplary configuration of output multiplexer 420, wherein the inverse of signal OK is used as the select line for multiplexer 420, signal CE carries a "1" into the "0" input terminal and the signal O is fed into the "1" input terminal. In this manner, the output line 462 of multiplexer 420 provides the OR function of signals O and OK. FIG. 10C illustrates an exemplary configuration of output multiplexer 420, wherein the signal OK is used as the select line for multiplexer 420, signal CE is programmed to carry a "1" into the "0" input terminal and the signal O is fed into the "1" input terminal. In this manner, the output line 462 of multiplexer 420 provides the OR function of signal O and /OK. FIG. 10D illustrates an exemplary configuration of output multiplexer 420, wherein the inverse of signal OK is used as the select line for multiplexer 420, signal CE is programmed to carry a "1" into the "0" input terminal and the inverse of signal O is fed into the "1" input terminal. In this manner, the output line 462 of multiplexer 420 provides the OR function of signals /O and OK. Table II below illustrates the logic gates realized by output multiplexer 420 and the appropriate figure showing the gate configuration.

TABLE II

| Function | FIG. |
| --- | --- |
| /OK OR /o | FIG. 10A |
| OK OR o | FIG. 10B |
| /OK OR o | FIG. 10C |
| OK OR /o | FIG. 10D |

An alternative embodiment provides an added multiplexer along line 312 (of FIG. 5) to allow /CE. By utilizing the configurations of FIG. 10A, FIG. 10B, FIG. 10C, and FIG. 10D but (1) tieing the O signal line (line 310) high, instead of the CE signal line (line 312), (2) configuring the CE signal line like the O signal line of the figures, the present invention output multiplexer 420 can alternatively realize the following functions: /OK OR /CE; OK OR CE; /OK OR CE; and OK OR /CE.

Figure 11A:
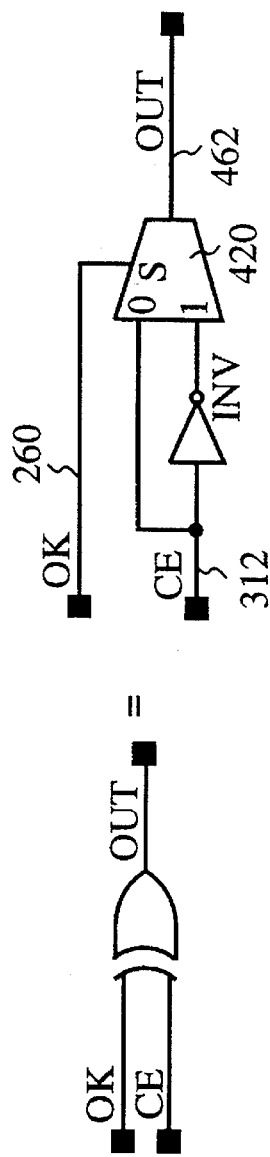
FIG. 11A and FIG. 11B are configurations of the output multiplexer of the present invention for realizing an XOR and an XNOR function.
Figure 11B:
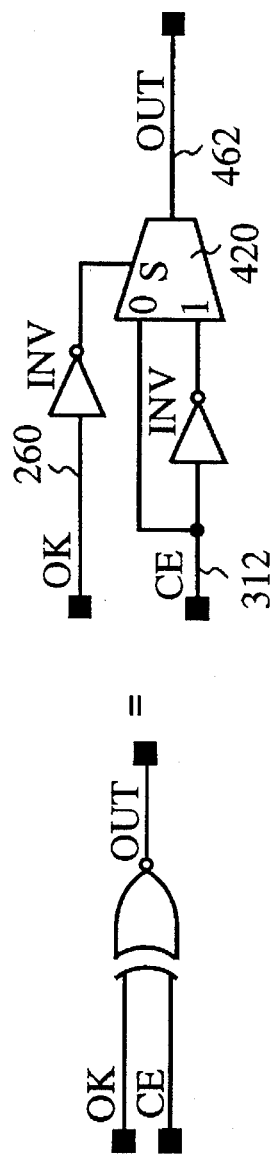

Output multiplexer 420 of the present invention can also be configured to perform XOR functions. FIG. 11A illustrates an exemplary configuration of output multiplexer 420, wherein the signal OK is used as the select line for multiplexer 420, signal CE is coupled to the "0" input terminal and the inverse of signal CE is fed into the "1" input terminal. In this manner, the output line 462 of multiplexer 420 provides the XOR function of signals CE and OK. FIG. 11b illustrates an exemplary configuration of output multiplexer 420 wherein the inverse of signal OK is used as the select line for multiplexer 420, signal CE is coupled to the "0" input terminal, and the inverse of signal CE is fed into "1" input terminal. In this manner, the output line 462 of multiplexer 420 provides the XNOR function of signals CE and OK. Table III below illustrates the logic gates realized by the output multiplexer and the appropriate figure showing the gate configuration.

TABLE III

| Function | FIG. |
| --- | --- |
| OK XOR CE | FIG. 11A |
| OK XNOR CE | FIG. 10B |

An alternative embodiment adds a multiplexer on line 312 (of FIG. 5) to allow signal O to be input to both inputs of multiplexer 428. By utilizing the configurations of FIG. 11A and FIG. 11B and substituting O signal line for the CE signal line, the present invention output multiplexer 420 can alternatively realize the following functions: OK XOR O and OK XNOR O. Note that other logic functions not listed herein can be implemented with various combinations of the three inputs.

A typical application of high speed logic gate (multiplexer) 420 realized within the above embodiment of the present invention can be for generating board or system level enable, reset, or other signals upon an address match or any other logic condition. In this application, CLBs or decoders and CLBs can be used to perform the address comparison and match functions. High speed gate (multiplexer) 420 is used to signal the match very rapidly after the strobe signal is received. In this case, the O input signal indicates the match signal while the OK clock is the strobe. By configuring output multiplexer 420 in an AND configuration (e.g., FIG. 9A), the output signal of circuit 420 represents O AND OK. The output signal is then used as a board level enable signal which comes on chip and goes off chip within about 7 ns in one embodiment.

The preferred embodiment of the present invention, an output multiplexer within an IOB for providing time multiplexed output signals over a single pad and also for providing a high speed gate, is thus described. While the present invention has been described in particular embodiments, it should be appreciated that the present invention should not be construed as limited by such embodiments, but rather construed according to the below claims.

What is claimed is:

1. In a programmable integrated circuit, an input/output circuit (IOB) comprising:
   a first multiplexer circuit receiving a first data signal and receiving a second data signal and generating an output data signal in response thereto, said first multiplexer circuit having a select line controlled by a signal;
   a second multiplexer circuit coupled to receive said output data signal from said first multiplexer circuit and coupled to receive at least one other alternate data signal, said second multiplexer circuit having a select line controlled by a programmable memory cell, wherein an output of said multiplexer circuit is coupled to an input/output pad of said programmable integrated circuit.

2. An input/output circuit as described in claim 1 wherein said at least one other alternate data signal received by said second multiplexer circuit is said first data signal.

3. An input/output circuit as described in claim 1 wherein said second multiplexer circuit is programmed to select said output data signal of said first multiplexer circuit and wherein said first multiplexer circuit is for time multiplexing said first data signal and said second data signal over said pad of said programmable integrated circuit.

4. An input/output circuit as described in claim 1 further comprising:
   a latch circuit having an output coupled to said second multiplexer circuit as said at least one other alternate data signal, said latch circuit clocked by a clock; and
   a third multiplexer circuit receiving as inputs said first data signal and said second data signal and having an output coupled to an input of said latch circuit, said third multiplexer circuit having a select line coupled to a programmable memory cell.

5. An input/output circuit as described in claim 1 wherein said first multiplexer circuit is for realizing a high speed logic AND gate of said second data signal and said signal provided said first data signal is held low.

6. An input/output circuit as described in claim 1 wherein said first multiplexer circuit is for realizing a high speed logic OR gate of said second data signal and said signal provided said first data signal is held high.

7. An input/output circuit as described in claim 1 wherein said first multiplexer circuit is for realizing a high speed logic XOR gate of said first data signal and said signal provided said first data signal and an inverse of said first data signal are input to said first multiplexer circuit.

8. A programmable integrated circuit having an input/output circuit (IOB) comprising:
   a first multiplexer circuit receiving a first data signal and receiving a second data signal and generating an output data signal in response thereto, said first multiplexer circuit having a select line controlled by a signal;
   a second multiplexer circuit coupled to receive said output data signal from said first multiplexer circuit and coupled to receive at least one other alternate data signal, said second multiplexer circuit having a select line controlled by a programmable memory cell; and
   a buffer circuit coupled to an output of said second multiplexer circuit for buffering said output data signal, wherein an output of said buffer circuit is coupled to an input/output pad of said programmable integrated circuit;
   wherein said second multiplexer circuit is programmed to select said output data signal of said first multiplexer circuit and wherein said first multiplexer circuit is for time multiplexing said first data signal and said second data signal over said pad of said programmable integrated circuit referenced by said signal.

9. A programmable integrated circuit as described in claim 8 wherein said at least one other alternate data signal received by said second multiplexer circuit is said first data signal.

10. A programmable integrated circuit as described in claim 8 further comprising:
    a latch circuit having an output coupled to said second multiplexer circuit as said at least one other alternate data signal, said latch circuit clocked by said signal; and
    a third multiplexer circuit receiving as inputs said first data signal and said second data signal and having an output coupled to an input of said latch circuit, said third multiplexer circuit having a select line coupled to a programmable memory cell.

11. A programmable integrated circuit as described in claim 8 wherein said first multiplexer circuit is for realizing a high speed logic AND gate of said second data signal and said signal provided said first data signal is held low.

12. A programmable integrated circuit as described in claim 8 wherein said first multiplexer circuit is for realizing a high speed logic OR gate of said second data signal and said signal provided said first data signal is held high.

13. A programmable integrated circuit as described in claim 8 wherein said first multiplexer circuit is for realizing a high speed logic XOR gate of said first data signal and said signal provided said first data signal and an inverse of said first data signal are input to said first multiplexer circuit.

14. A programmable integrated circuit as described in claim 8 wherein said first multiplexer circuit is for realizing a high speed logic XNOR gate of said first data signal and said signal provided said first data signal and an inverse of said first data signal are input to said first multiplexer circuit.

15. In a programmable integrated circuit having an input/output circuit (IOB), a method of generating an output signal comprising the steps of:
    receiving a first data signal and a second data signal at a first multiplexer and generating an output data signal in response thereto;
    controlling a select line of said first multiplexer circuit by a signal;
    receiving said output data signal from said first multiplexer circuit and receiving at least one other alternate data signal at a second multiplexer;
    controlling a select line of said second multiplexer circuit by a programmable memory cell;
    buffering said output data signal with a buffer circuit, an output of said buffer circuit coupled to an input/output pad of said programmable integrated circuit;
    programming said second multiplexer circuit to select, as output, said output data signal of said first multiplexer circuit; and
    with said first multiplexer, time multiplexing said first data signal and said second data signal over said pad of said programmable integrated circuit in synchronization with said signal.

16. A method as described in claim 15 further comprising the step of controlling said buffer circuit with a tristate signal wherein said tristate signal causes said buffer circuit to tristate output.

17. A method as described in claim 15 further comprising the steps of: holding said first data signal low; and using said first multiplexer circuit to realize a high speed logic AND gate of said second data signal and said signal.

18. A method as described in claim 15 further comprising the steps of: holding said first data signal high; and using said first multiplexer circuit to realize a high speed logic OR gate of said second data signal and said signal.

19. A method as described in claim 15 further comprising the steps of: inputting said first data signal and an inverse of said first data signal to said first multiplexer circuit; and using said first multiplexer circuit to realize a high speed logic XOR gate of said first data signal and said signal.

20. In a programmable integrated circuit, an input/output circuit (IOB) comprising:
    a first multiplexer circuit receiving a first data signal and receiving a second data signal and generating an output data signal in response thereto, said first multiplexer circuit having a select line controlled by a first signal;
    a second multiplexer circuit coupled to receive as inputs a clock and an output from a first programmable memory cell, said second multiplexer circuit having a select line controlled by a second programmable memory cell, said second multiplexer circuit outputting said first signal on said select line of said first multiplexer circuit; and
    an integrated circuit input/output pad coupled to an output of said first multiplexer circuit.

21. An input/output circuit as described in claim 20 wherein:

said first multiplexer circuit is for realizing a high speed logic AND gate of said second data signal and said clock provided said first data signal is held low; and said first multiplexer circuit is for realizing a high speed logic OR gate of said second data signal and said clock provided said first data signal is held high.

22. A data transmission-reception configuration comprising:

(a) a first programmable integrated circuit having a first input/output circuit comprising:

an output multiplexer circuit receiving a first data signal and receiving a second data signal and generating an output data signal onto a first pad, said first multiplexer circuit having a select line controlled by an output clock;

(b) a second programmable integrated circuit having a second input/output circuit comprising:

a latch circuit clocked by an input clock, said latch circuit having a data input coupled to a second pad that is coupled to a first receiving line and having a data output coupled to a second receiving line, wherein said output clock and said input clock are of a same frequency; and (c) said first programmable integrated circuit and said second programmable integrated circuit being coupled together by said first pad and said second pad.

23. In a programmable integrated circuit, an input/output circuit (IOB) comprising:

a multiplexer circuit including a first data terminal, a second data terminal, and an output terminal, said multiplexer circuit including a select line controlled by an output clock, wherein an output of said multiplexer circuit is coupled to an input/output pad of said programmable integrated circuit.

* * * * *

UNITED STATES PATENT AND TRADEMARK OFFICE
CERTIFICATE OF CORRECTION

Page 1 of 2

PATENT NO. : 5,594,367

DATED : January 14, 1997

INVENTOR(S) : Stephen M. Trimberger, Khue Duong and Robert O. Conn, Jr.

It is certified that error appears in the above-identified patent and that said Letters Patent is hereby corrected as shown below:

On title page, item [56]
In the References Cited, "Petersen" should read --Pedersen--.

In the References Cited, "Tanana" should read --Tavana--.

Col. 5, line 3, "programable" should read --programmable--.

Col. 5, line 16, "programable" should read --programmable--.

Col. 6, line 14, "programable" should read --programmable--.

Col. 7, line 31, "data 0" should read --data O--.

Col. 8, line 8, "signals 0" should read --signals O--.

Col. 8, Table I, "º" should read --O--.

UNITED STATES PATENT AND TRADEMARK OFFICE
CERTIFICATE OF CORRECTION

PATENT NO. : 5,594,367

DATED : January 14, 1997

INVENTOR(S) : Stephen M. Trimberger, Khue Duong and Robert O. Conn, Jr.

It is certified that error appears in the above-identified patent and that said Letters Patent is hereby corrected as shown below:

Col. 9, Table II, "°" should read --O--.

Signed and Sealed this

Twenty-fourth Day of February, 1998

Attest:

BRUCE LEHMAN

Attesting Officer      Commissioner of Patents and Trademarks